US011725284B2

(12) United States Patent
Kikama et al.

(10) Patent No.: US 11,725,284 B2
(45) Date of Patent: Aug. 15, 2023

(54) SUBSTRATE PROCESSING APPARATUS AND SUBSTRATE PROCESSING METHOD

(71) Applicant: Tokyo Electron Limited, Tokyo (JP)

(72) Inventors: Eiji Kikama, Nirasaki (JP); Chiaki Takeuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 147 days.

(21) Appl. No.: 17/326,937

(22) Filed: May 21, 2021

(65) Prior Publication Data

US 2021/0371983 A1 Dec. 2, 2021

(30) Foreign Application Priority Data

May 29, 2020 (JP) .................. 2020-094880

(51) Int. Cl.
*C23C 16/455* (2006.01)
*C23C 16/458* (2006.01)

(52) U.S. Cl.
CPC .... *C23C 16/45578* (2013.01); *C23C 16/4584* (2013.01)

(58) Field of Classification Search
CPC .................. C23C 16/45578; C23C 16/45502
See application file for complete search history.

(56) References Cited

U.S. PATENT DOCUMENTS

| 5,972,116 A * | 10/1999 | Takagi ............ H01L 21/67017 118/725 |
| 8,002,895 B2 * | 8/2011 | Inoue .................. C23C 16/345 156/345.33 |
| 2010/0035440 A1 * | 2/2010 | Fukuda ............ H01L 21/02255 118/724 |
| 2012/0094010 A1 * | 4/2012 | Sugiura .................. C23C 16/52 427/8 |

FOREIGN PATENT DOCUMENTS

JP 2018195727 A 12/2018

* cited by examiner

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A technique for improving uniformity in a plane of a substrate is provided. A substrate processing apparatus according an aspect of the present disclosure includes a processing container having a substantially cylindrical shape, a gas nozzle extending in a vertical direction along an inside of an inner wall of the processing container and forming a gas flow path therein, and a gas ejector provided on the processing container and communicating with the gas flow path, the gas ejector being configured to distribute a gas introduced from the gas nozzle and to eject the gas from an outer peripheral portion of the processing container.

12 Claims, 18 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-094880, filed on May 29, 2020, the entire contents of which are incorporated herein by reference.

TECHNICAL FIELD

The present disclosure relates to a substrate processing apparatus and a substrate processing method.

BACKGROUND

A film forming method, in which multiple wafers are arranged in a processing container, a raw material gas for film formation is supplied from a predetermined position of a side direction of the multiple wafers along surfaces of the multiple wafers, and a predetermined film is formed on the multiple wafers by reaction active species generated from the raw material gas for the film formation, is known (see, for example, Patent Document 1). In Patent Document 1, a gas for use in adjusting concentration is supplied to the surfaces of the multiple wafers from a position that is different from a predetermined position.

PRIOR ART DOCUMENT

Patent Document

Patent Document 1: Japanese Laid-Open Patent Publication No. 2018-195727

SUMMARY

According to an aspect of the present disclosure, a substrate processing apparatus includes a processing container having a substantially cylindrical shape, a gas nozzle extending in a vertical direction along an inside of an inner wall of the processing container and forming a gas flow path therein, and a gas ejector provided on the processing container and communicating with the gas flow path, the gas ejector being configured to distribute a gas introduced from the gas nozzle and to eject the gas from an outer peripheral portion of the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
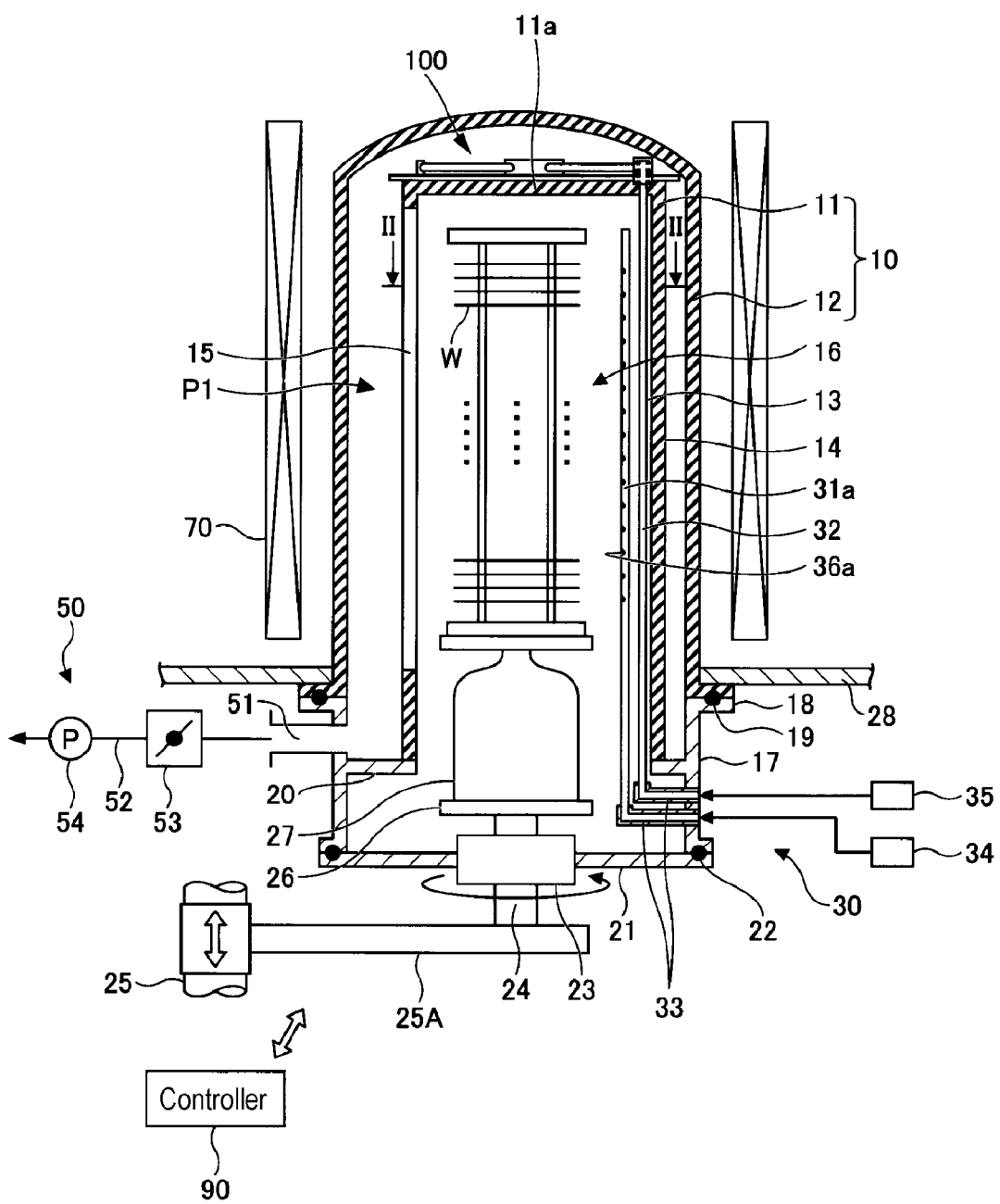
FIG. 1 is a schematic view illustrating an example of a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant explanations will be omitted.

[Substrate Processing Apparatus]

Figure 2:
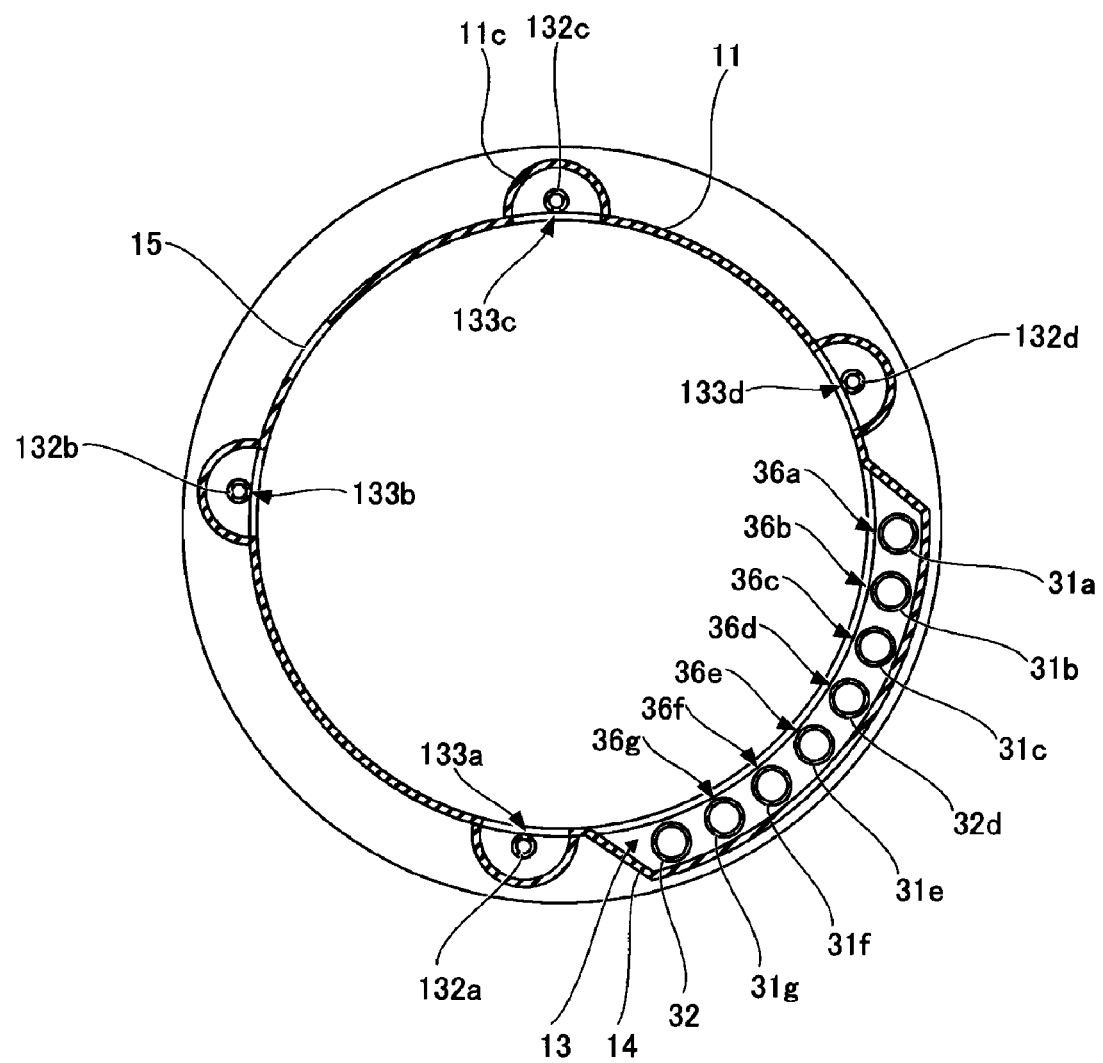
FIG. 2 is a cross-sectional view taken along a line II-II in FIG. 1.
Figure 3:
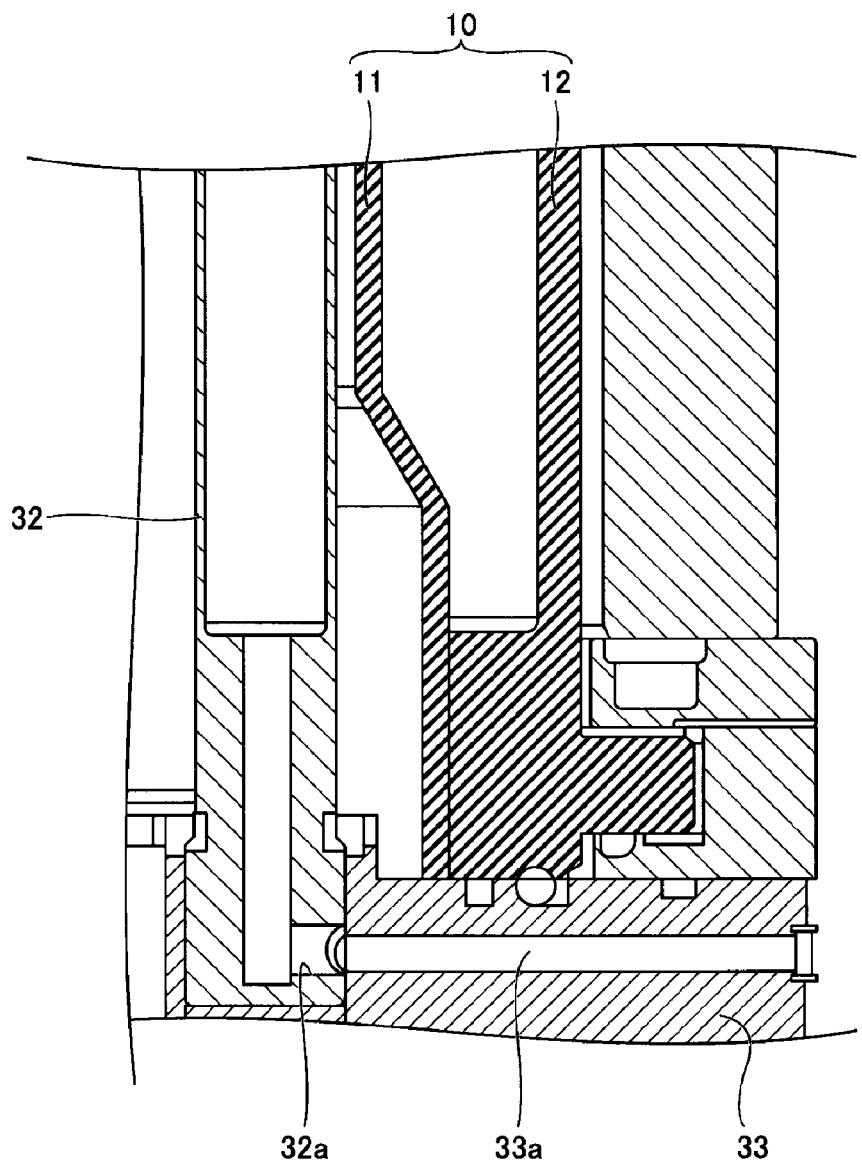
FIG. 3 is a cross-sectional view illustrating an example of a nozzle support.

An example of a substrate processing apparatus of an embodiment will be described with reference to FIGS. 1 to 3. FIG. 1 is a schematic view illustrating an example of a substrate processing apparatus according to an embodiment. FIG. 2 is a cross-sectional view taken along a line II-II in FIG. 1. FIG. 3 is a cross-sectional view illustrating an example of a nozzle support.

The substrate processing apparatus 1 includes a processing container 10, a gas supply 30, an exhaust 50, a heater 70, a dilution gas ejector 100, and a controller 90.

The processing container 10 accommodates a boat 16. The boat 16 holds multiple substrates substantially horizontally at intervals in the vertical direction. The substrates may be, for example, semiconductor wafers (hereinafter referred to as "wafers W"). The processing container 10 includes an internal tube 11 and an external tube 12. The internal tube 11 is also referred to as an "inner tube", and is formed in a substantially cylindrical shape having a ceiling and an opened lower end. In the internal tube 11, the ceiling portion 11a is formed, for example, flat. The external tube 12 is also referred to as an "outer tube", and is formed in a substantially cylindrical shape having a ceiling and an opened lower end, and encompasses outside of the internal tube 11. The internal tube 11 and the external tube 12 are coaxially arranged so as to have a double-tube structure. The internal tube 11 and the external tube 12 are formed of a heat resistant material such as quartz.

On one side of the internal tube 11, an accommodation portion 13 configured to accommodate a gas nozzle is provided along a longitudinal direction (a vertical direction) of the internal tube 11. For example, as illustrated in FIG. 2, a portion of a side wall of the internal tube 11 protrudes outwards so as to form a convex portion 14, and inside of the convex portion 14 is formed as the accommodation portion 13. In the side wall of the internal tube 11 opposite to the accommodation portion 13, a rectangular opening 15 is provided in the longitudinal direction (the vertical direction) thereof. The opening 15 is a gas exhaust port formed so as to be capable of exhausting the gas in the internal tube 11. The length of the opening 15 is formed to be equal to or longer than the length of the wafer boat 16 so as to extend in the up-and-down direction.

A lower end of the processing container 10 is supported by a substantially cylindrical manifold 17 formed of, for example, stainless steel. A flange 18 is formed at an upper end of the manifold 17, and the lower end of the external tube 12 is installed and supported on the flange 18. A sealing member 19, such as an O-ring, is interposed between the flange 18 and the lower end of the external tube 12 so as to hermetically seal the inside of the external tube 12.

An annular support 20 is provided on an inner wall of an upper portion of the manifold 17, and the lower end of the internal tube 11 is installed and supported on the support 20. A lid 21 is hermetically installed on the lower end opening of the manifold 17 via a sealing member 22, such as an O-ring, so as to hermetically close the lower end opening of the processing container 10, that is, the opening of the manifold 17. The lid 21 is formed of, for example, stainless steel.

As a central portion of the lid 21, a rotary shaft 24 configured to rotatably support the boat 16 is provided through a magnetic fluid seal 23. A lower portion of the rotary shaft 24 is rotatably supported by an arm 25A of a lift mechanism 25 configured as a boat elevator.

A rotary plate 26 is provided at an upper end of the rotary shaft 24, and the boat 16, which holds wafers W, is placed on the rotary plate 26 via a quartz heat-insulating base 27. Therefore, by moving the lift mechanism 25 up and down, the lid 21 and the boat 16 move up and down as a unit so that the boat 16 can be inserted into and removed from the inside of the processing container 10.

The gas supply 30 is provided in the manifold 17. The gas supply 30 has multiple (e.g., seven) processing gas nozzles 31a to 31g, a dilution gas nozzle 32, and a nozzle support 33.

As illustrated in FIG. 2, the processing gas nozzles 31a to 31g are arranged at intervals of each other so as to form a line along a circumferential direction in the accommodation portion 13 inside the inner wall of the internal tube 11. In FIG. 1, illustration of the processing gas nozzles 31b to 31g is omitted. Each of the processing gas nozzles 31a to 31g extends along the longitudinal direction (the vertical direction) of the internal tube 11 inside the inner wall of the internal tube 11, and the lower end thereof is inserted into the nozzle support 33. Each of the processing gas nozzles 31a to 31g is a straight tube having a circular cross section, and is formed of, for example, quartz. Each of the processing gas nozzles 31a to 31g has a tip (an upper end) that is closed and an opening at a base end (a lower end). Multiple gas holes 36a to 36g are formed at predetermined intervals along the longitudinal direction in each of the processing gas nozzles 31a to 31g. The multiple gas holes 36a to 36g are oriented to face, for example, the center (a wafer W) of the internal tube 11.

The processing gas nozzles 31a to 31g eject various processing gases, which are introduced from a processing gas supply source 34, from the multiple gas holes 36a to 36g toward the multiple wafers W placed on the boat 16. Examples of the various processing gases include film forming gases such as a raw material gas containing silicon or metal and a reaction gas containing oxygen or nitrogen.

As illustrated in FIG. 2, a dilution gas nozzle 32 is disposed in the accommodation portion 13 inside the inner wall of the internal tubes 11 at an interval from the processing gas nozzle 31g along the circumferential direction. The dilution gas nozzle 32 extends along the longitudinal direction of the internal tube 11 inside the inner wall of the internal tube 11. An upper end of the dilution gas nozzle 32 is fitted to a fitting portion 121 of the dilution gas ejector 100, and a lower end of the dilution gas nozzle 32 is fitted to the nozzle support 33. The dilution gas nozzle 32 is a straight tube having a circular cross section, and is made of, for example, quartz. The dilution gas nozzle 32 has an opening 32a (see FIG. 3) at a base end (the lower end) thereof and an opening 32b (see FIG. 12) at a tip (the upper end) thereof.

The dilution gas nozzle 32 allows a dilution gas introduced from a dilution gas supply source 35 to flow to the dilution gas ejector 100 via the fitting portion 121. Examples of the dilution gas include an inert gas such as nitrogen gas and argon gas. The dilution gas ejector 100 will be described later.

As illustrated in FIG. 3, the nozzle support 33 is provided so as to penetrate the processing container 10 and supports the lower ends of the processing gas nozzles 31a to 31g and the dilution gas nozzle 32 inside the processing container 10. The nozzle support 33 includes a gas flow path 33a, which allows a gas to flow through the inside of the nozzle support 33. The gas flow path 33a allows various processing gases introduced from the processing gas supply source 34 to flow through the processing gas nozzles 31a to 31g, and allows the dilution gas introduced from the dilution gas supply source 35 to flow through the dilution gas nozzle 32.

The exhaust 50 exhausts a gas discharged from the inside of the internal tube 11 through the opening 15 and discharged from a gas outlet 51 through a space P1 between the internal tube 11 and the external tube 12. The gas outlet 51 is formed in an upper sidewall of the manifold 17 and above the support 20. An exhaust passage 52 is connected to the gas outlet 51. A pressure adjustment valve 53 and a vacuum pump 54 are sequentially installed in the exhaust passage 52 so as to evacuate the inside of the processing container 10.

The heater 70 is provided near the external tube 12. The heater 70 is provided, for example, on the base plate 28. The heater 70 has a substantially cylindrical shape so as to cover the external tube 12. The heater 70 includes, for example, a heating element, and heats the wafers W in the processing container 10.

The controller 90 controls operations of each part of the substrate processing apparatus 1. The controller 90 may be, for example, a computer. A computer program that performs operations of each part of the substrate processing apparatus 1 is stored in a storage medium. The storage medium may be, for example, a flexible disk, a compact disc, a hard disk, a flash memory, a DVD, or the like.

[Dilution Gas Ejector]

Figure 4:
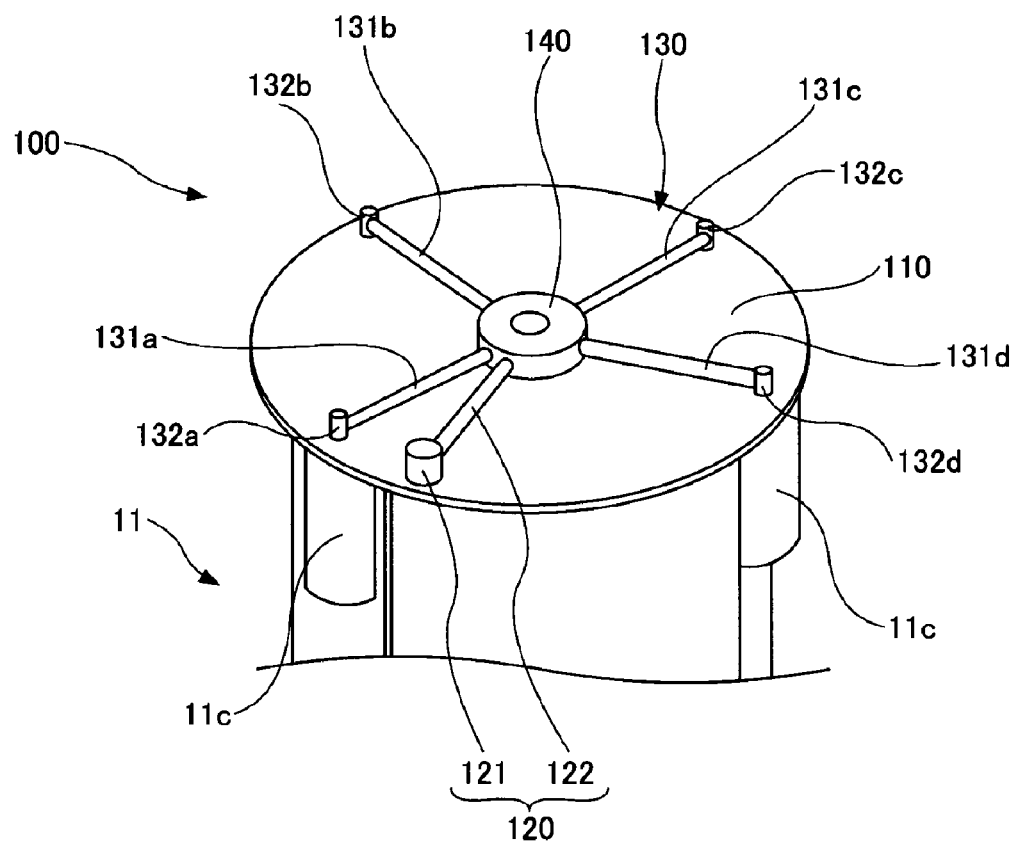
FIG. 4 is a perspective view (1) illustrating an example of a dilution gas ejector.
Figure 5:
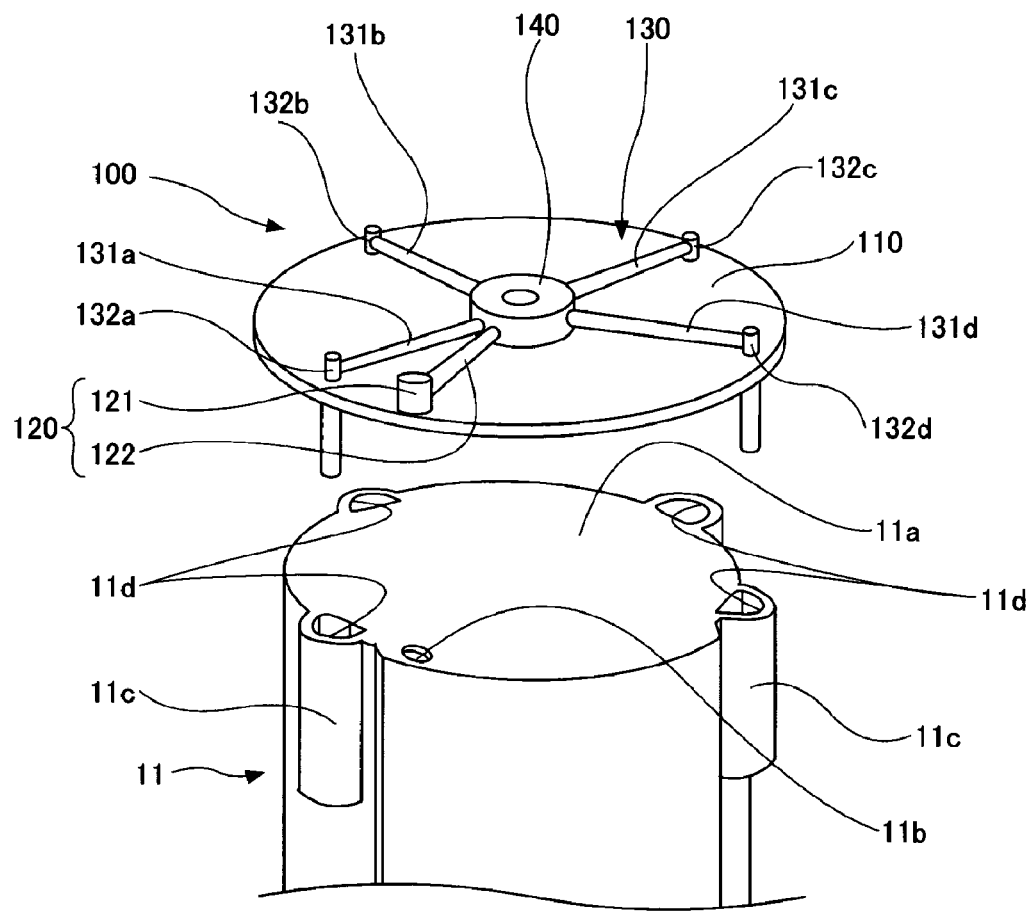
FIG. 5 is a perspective view (2) illustrating an example of a dilution gas ejector.
Figure 6:
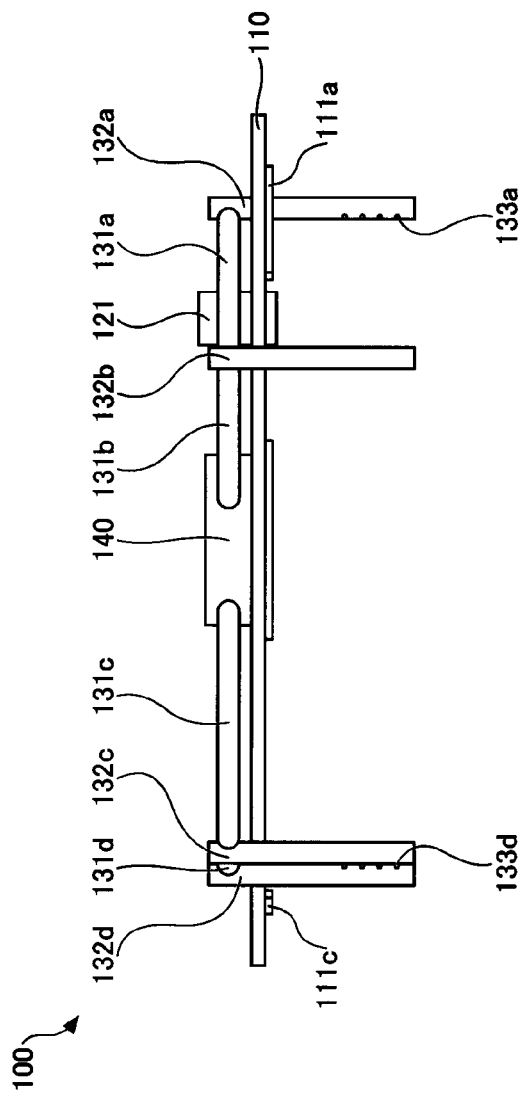
FIG. 6 is a view illustrating the dilution gas ejector when viewed from a side.
Figure 7:
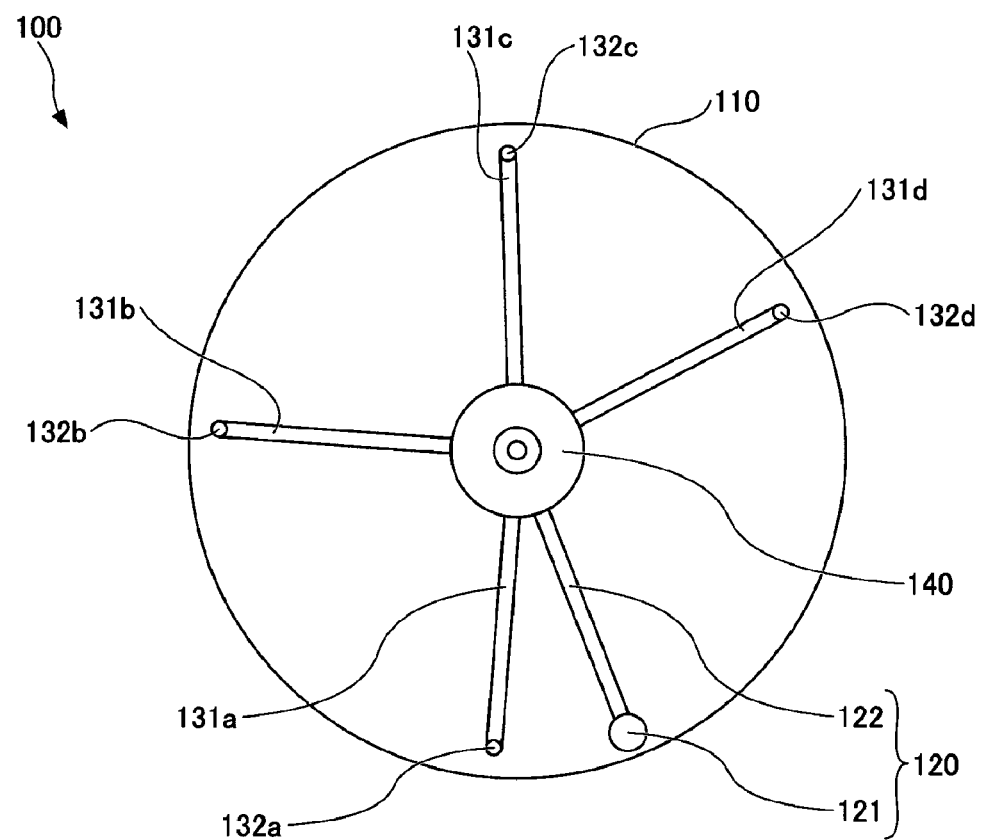
FIG. 7 is a view illustrating the dilution gas ejector when viewed from above.
Figure 8:
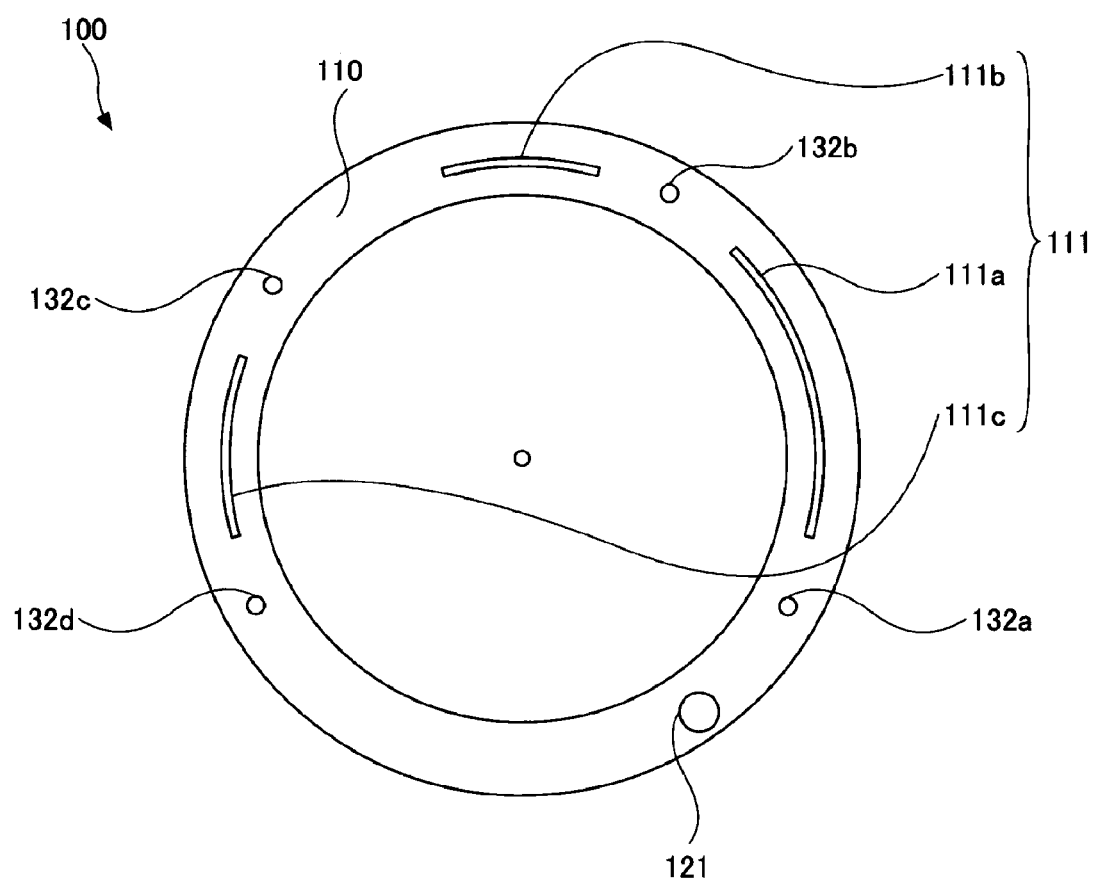
FIG. 8 is a view illustrating the dilution gas ejector when viewed from below.

An example of the dilution gas ejector 100 included in the substrate processing apparatus 1 of the embodiment will be described with reference to FIGS. 4 to 15. FIG. 4 is a perspective view illustrating an example of a dilution gas ejector 100 in the state in which the dilution gas ejector 100 is mounted on the internal tube 11. FIG. 5 is a perspective view illustrating an example of a dilution gas ejector 100 in the state in which the dilution gas ejector 100 is removed from the internal tube 11. FIG. 6 is a view illustrating the dilution gas ejector 100 when viewed from a side. FIG. 7 is a view illustrating the dilution gas ejector 100 when viewed from above. FIG. 8 is a view illustrating the dilution gas ejector 100 when viewed from below.

The dilution gas ejector 100 is provided on the internal tube 11. The dilution gas ejector 100 distributes a dilution gas introduced from the dilution gas nozzle 32 and ejects the dilution gas from an outer peripheral portion of the internal tube 11 into the internal tube 11. The dilution gas ejector 100 includes a lid 110, an inlet 120, an outlet 130, and a distribution portion 140.

Figure 9:
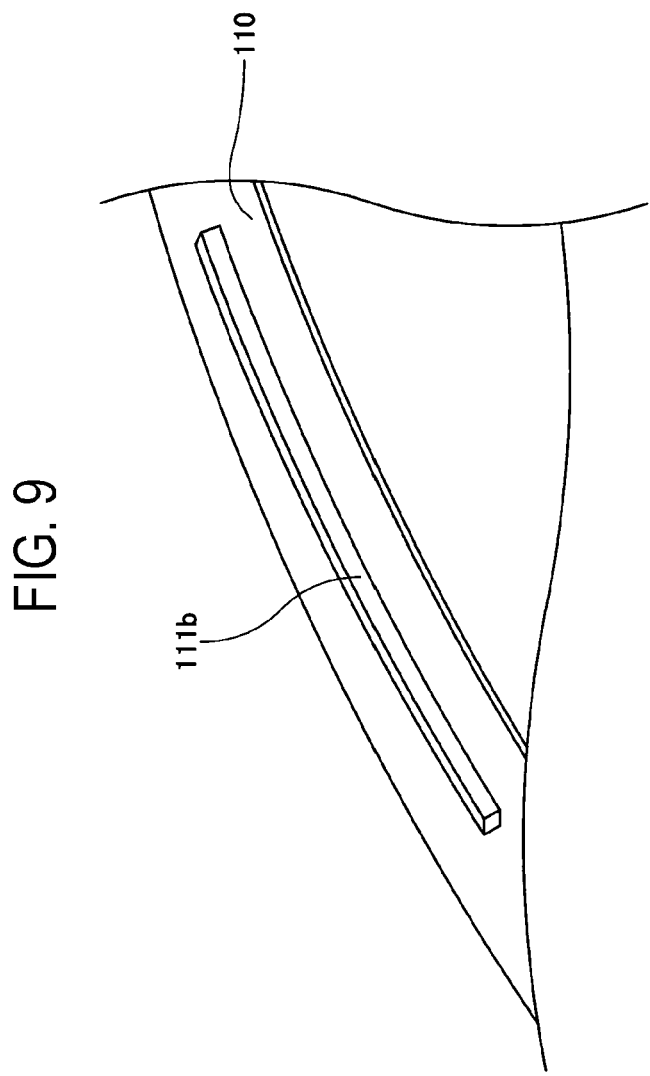
FIG. 9 is an enlarged perspective view illustrating a portion of FIG. 8.

The lid 110 has a disk shape which is larger than a ceiling portion 11a of the internal tube 11, and is mounted on the internal tube 11. A position regulator 111 is provided on the bottom surface of the lid 110. FIG. 9 is an enlarged perspective view showing a portion of FIG. 8.

The position regulator 111 includes multiple (e.g., three) protrusions 111a to 111c. The multiple protrusions 111a to 111c are arranged so as to be spaced apart from each other along the circumferential direction of the lid 110. Each of the protrusions 111a to 111c extends downward from the bottom surface of the lid 110 and extends in an arc shape along the circumferential direction of the lid 110. Each of the protrusions 111a to 111c is disposed slightly outside the outer peripheral portion of the ceiling portion 11a of the internal tube 11. As a result, when the lid 110 is mounted on the internal tube 11, the inner surface of each of the protrusions 111a to 111c comes into contact with an outer wall of the ceiling portion 11a of the internal tube 11 so that the position of the lid 110 with respect to the internal tube 11 is regulated.

Figure 10:
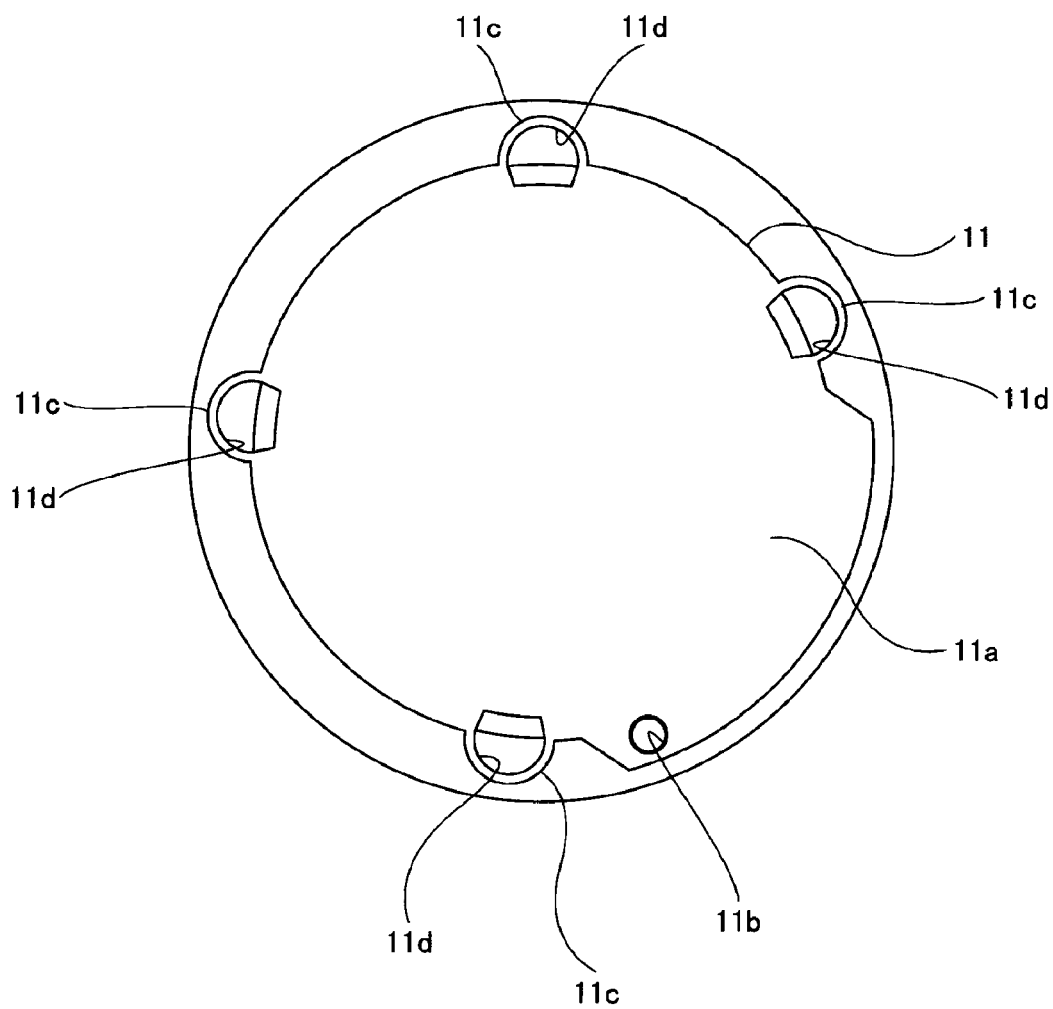
FIG. 10 is a view illustrating an internal tube when viewed from above.
Figure 11:
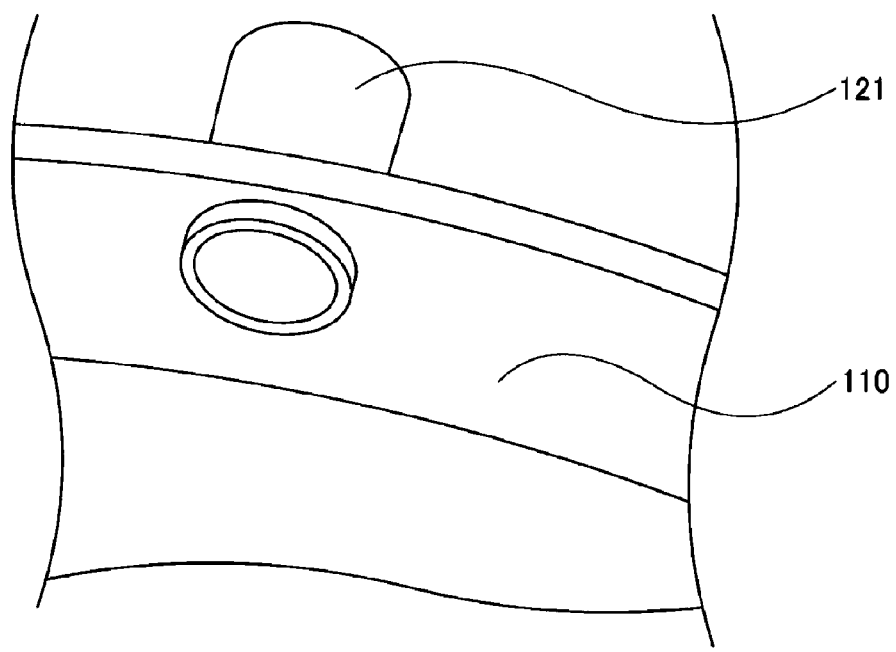
FIG. 11 is an enlarged perspective view illustrating a fitting portion of a dilution gas ejector.
Figure 12:
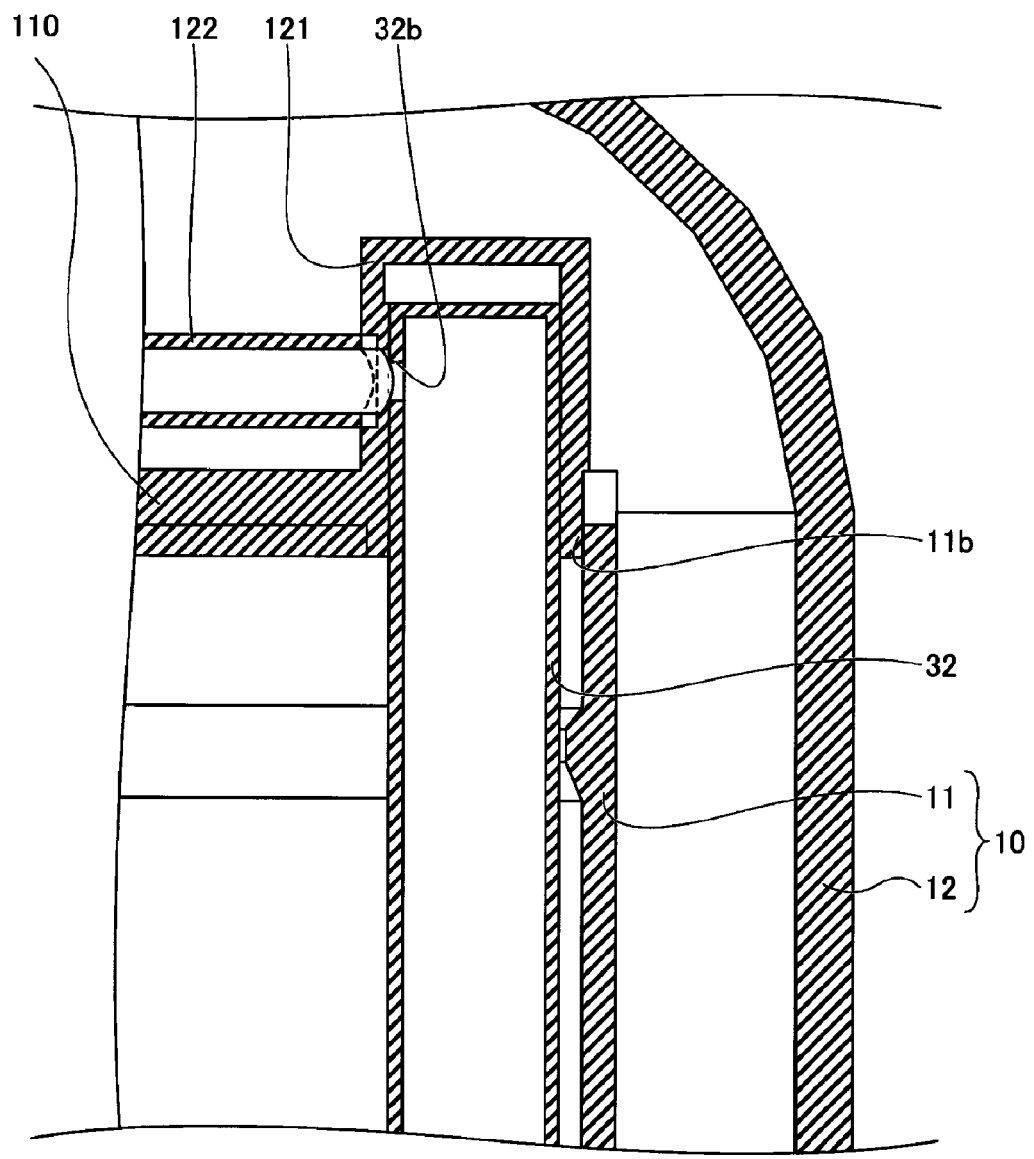
FIG. 12 is an enlarged cross-sectional view illustrating the fitting portion of the dilution gas ejector.

The inlet 120 includes a fitting portion 121 and a horizontal portion 122. FIG. 10 is a view illustrating the internal tube 11 when viewed from the above. FIG. 11 is an enlarged perspective view illustrating the fitting portion 121 of the dilution gas ejector 100. FIG. 12 is an enlarged cross-sectional view illustrating the fitting portion 121 of the dilution gas ejector 100.

The fitting portion 121 has a substantially cylindrical shape having a closed upper end and an opened lower end, and is provided so as to penetrate the ceiling portion 11a and the lid 110 of the internal tube 11. The fitting portion 121 is formed at the same position as an insertion hole 11b formed in the ceiling portion 11a of the internal tube 11 in a plan view, and the lower end thereof can be fitted into the insertion hole 11b. The tip of the dilution gas nozzle 32 is inserted into the fitting portion 121. An opening (not illustrated) is formed at the center of the lid 110 in the fitting portion 121.

The horizontal portion 122 extends in a horizontal direction along a radial direction of the lid 110. One end of the horizontal portion 122 is connected to the fitting portion 121, and the inside of the horizontal portion 122 communicates with the inside of the dilution gas nozzle 32 through the opening in the fitting portion 121. The other end of the horizontal portion 122 is connected to the distribution portion 140.

The inlet 120 forms an inflow path through the fitting portion 121 and the horizontal portion 122 to allow the dilution gas introduced from the dilution gas nozzle 32 to flow to the distribution portion 140. In addition, the fitting portion 121 and the horizontal portion 122 are formed of a heat-resistant material such as quartz.

Figure 13:
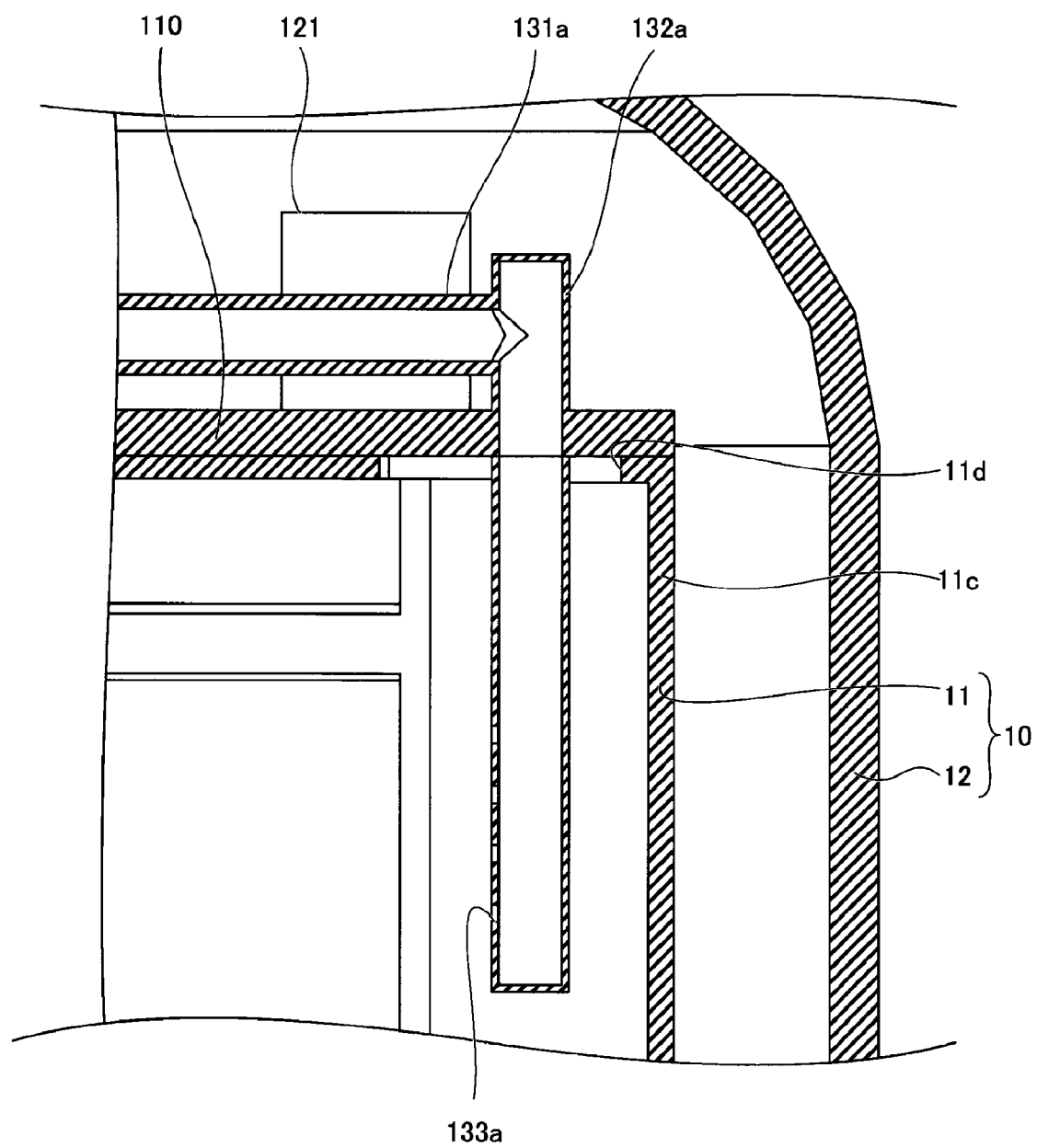
FIG. 13 is an enlarged cross-sectional view illustrating an ejection portion of the dilution gas ejector.

The outlet 130 includes multiple (e.g., four) horizontal portions 131a to 131d and multiple (e.g., four) ejection portions 132a to 132d. FIG. 13 is an enlarged cross-sectional view illustrating the ejection portion 132a of the dilution gas ejector 100.

The multiple horizontal portions 131a to 131d extend horizontally from the distribution portion 140 to the outer peripheral portion of the lid 110 so as to spread radially. One end of each of the horizontal portions 131a to 131d is connected to the distribution portion 140, and the other end of each of the horizontal portions 131a to 131d is connected to the ejection portions 132a to 132d, respectively.

Each of the ejection portions 132a to 132d is formed in a tubular shape in which an upper end and a lower end are closed, and extends downward from the other end of corresponding one of the horizontal portions 131a to 131d through the ceiling portion 11a and the lid 110 of the internal tube 11. The lower ends of the ejection portions 132a to 132d are respectively inserted into convex portions 11c, which are formed by making portions of a side wall protrude toward outside in the upper portion of the internal tube 11. Openings 11d are formed in the convex portions 11c, respectively, and the ejection portions 132a to 132d are inserted into the convex portions 11c through the openings 11d, respectively. Each of the ejection portions 132a to 132d extends to a portion of a height area which includes the upper portion of the internal tube 11, for example, a height area that includes multiple wafers W placed on an upper portion of the boat 16. Multiple (for example, four) gas holes 133a to 133d are provided in each of the ejection portions 132a to 132d at intervals along the vertical direction. The multiple gas holes 133a to 133d are oriented to face, for example, the center (the wafer W) of the lid 110.

The outlet 130 forms multiple outflow paths for ejecting the dilution gas introduced from the distribution portion 140 into the internal tube 11 by the horizontal portions 131a to 131d, the ejection portions 132a to 132d, and the gas holes 133a to 133d. The horizontal portions 131a to 131d and the ejection portions 132a to 132d are formed of a heat-resistant material such as quartz.

Figure 14:
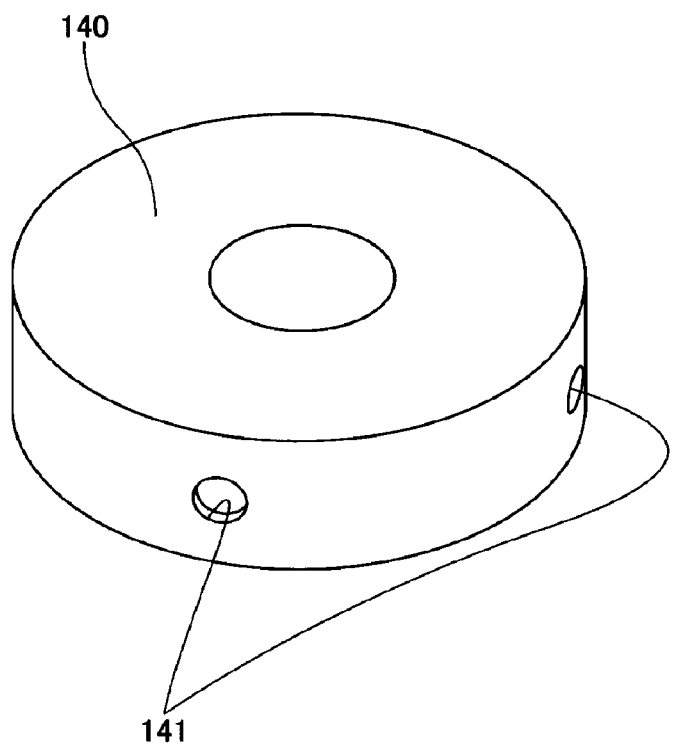
FIG. 14 is a perspective view illustrating external appearance of a distribution portion of the dilution gas ejector.
Figure 15:
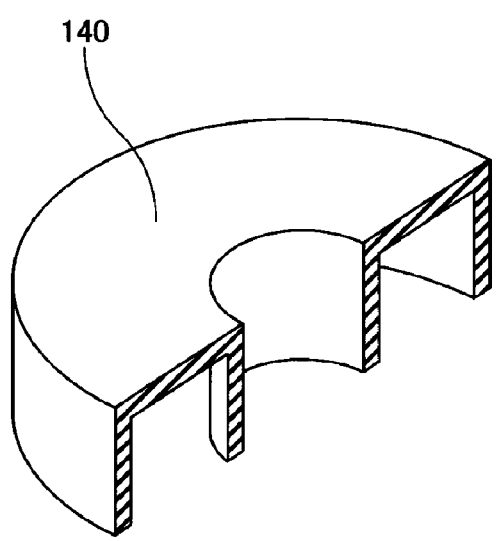
FIG. 15 is a perspective cross-sectional view illustrating inside of the distribution portion of the dilution gas ejector.

The distribution portion 140 has a donut shape and forms a distribution path therein. FIG. 14 is a perspective view illustrating an external appearance of the distribution portion 140 of the dilution gas ejector 100. FIG. 15 is a perspective cross-sectional view illustrating inside of the distribution portion 140 of the dilution gas ejector 100. Multiple (e.g., five) openings 141 are formed in the outer wall of the distribution portion 140, and the horizontal portion 122 and the multiple horizontal portions 131a to 131d are connected to the multiple openings 141, respectively. As a result, through the multiple openings 141, the inflow path and the distribution path communicate with each other and the distribution path and the multiple outflow paths communicate with each other. The distribution portion 140 is formed of a heat-resistant material such as quartz.

Figure 16:
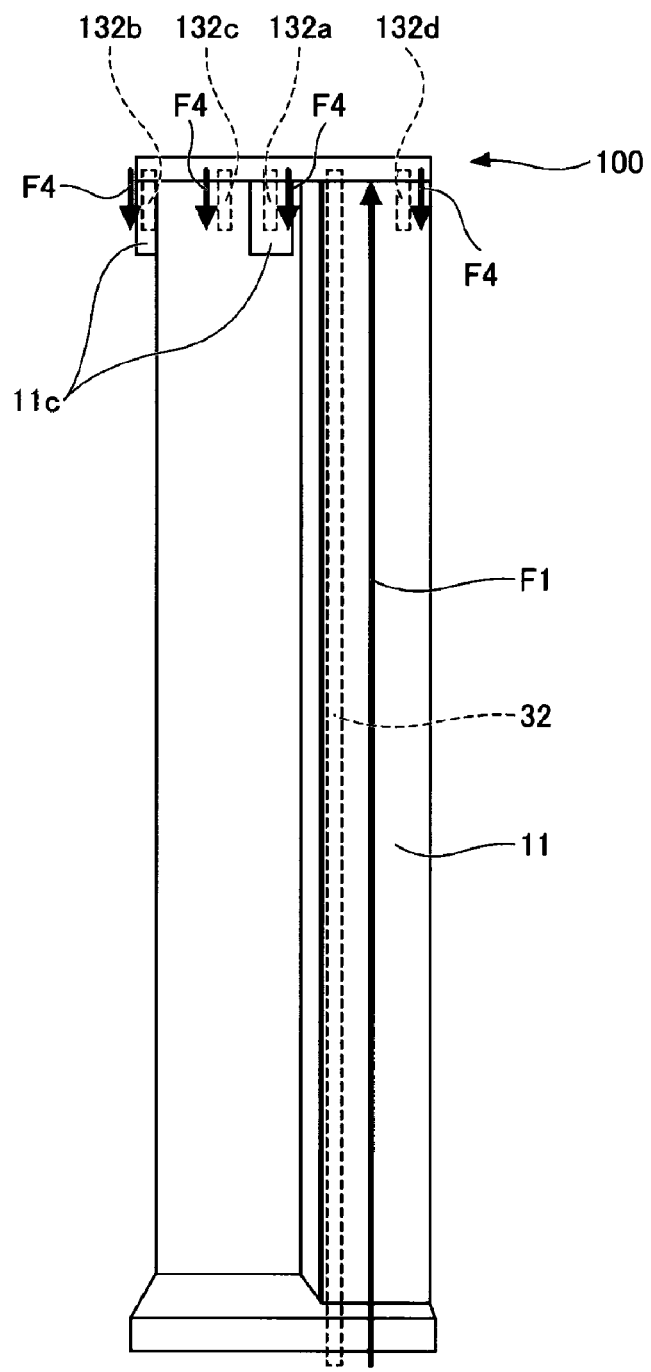
FIG. 16 is a view (1) for describing a flow of a dilution gas.
Figure 17:
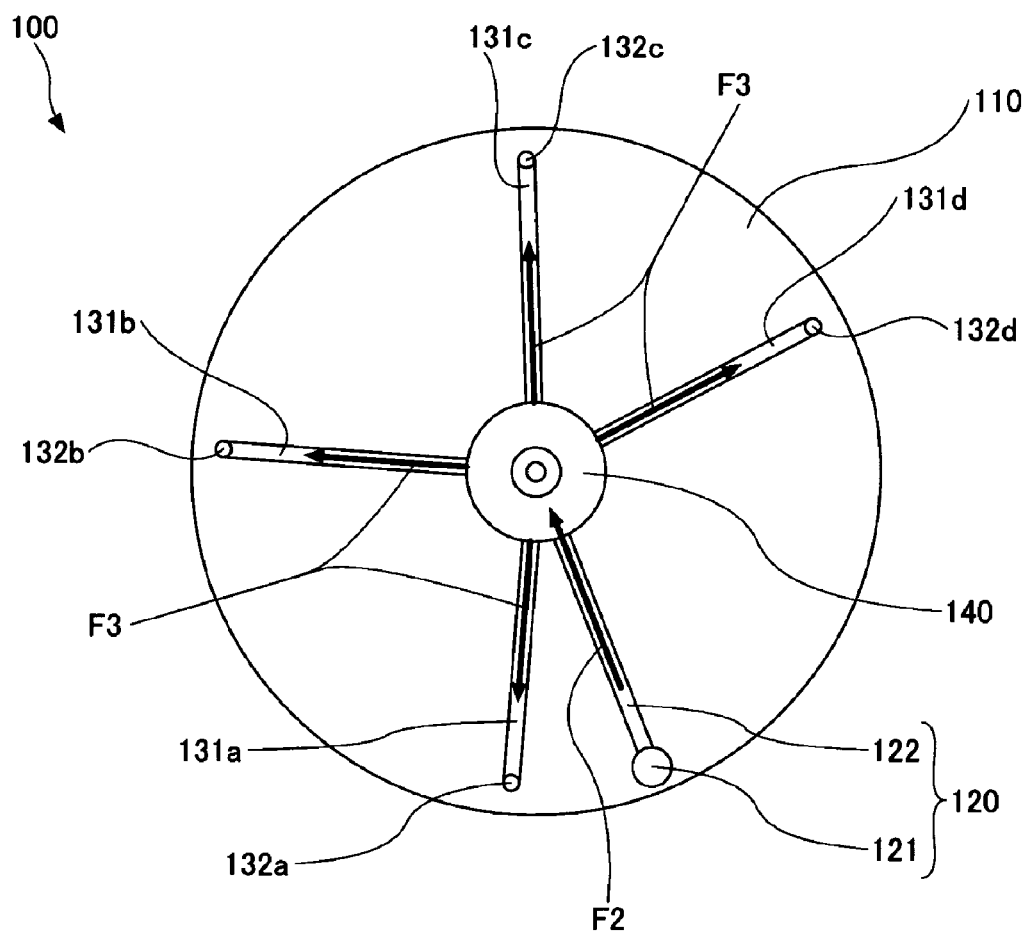
FIG. 17 is a view (2) for describing a flow of a dilution gas.

With reference to FIGS. 16 and 17, a flow of the dilution gas ejected into the processing container 10 by the dilution gas ejector 100 will be described. FIG. 16 is a view for describing a flow of a dilution gas when the internal tube 11 and the dilution gas ejector 100 are viewed from a side. FIG. 17 is a view for describing a flow of a dilution gas when the internal tube 11 and the dilution gas ejector 100 are viewed from above.

The dilution gas introduced from the dilution gas supply source 35 into the dilution gas nozzle 32 flows from the bottom to the top of the dilution gas nozzle 32 as indicated by the arrow F1 in FIG. 16, and is introduced into the dilution gas ejector 100.

As indicated by the arrow F2 in FIG. 17, the dilution gas introduced into the dilution gas ejector 100 is introduced into the horizontal portion 122 through the fitting portion 121, flows through the inflow path in the horizontal portion 122 from the outer peripheral portion to the center, and is introduced into the distribution path in the distribution portion 140.

The dilution gas introduced into the distribution path is distributed to the multiple outflow passages in the horizontal portions 131a to 131d, and flows through the multiple outflow paths from the center to the outer peripheral portion as indicated by the arrows F3 in FIG. 17. Then, as indicated by the arrows F4 in FIG. 16, the dilution gas flows from the top to the bottom of the outflow paths in the ejection portions 132a to 132d, and is ejected into the internal tube 11 from the multiple gas holes 133a to 133d.

As described above, according to the dilution gas ejector 100, a dilution gas is supplied from a side direction of the multiple wafers W placed on the upper portion of the boat 16 accommodated in the internal tube 11 along surfaces of the multiple wafers W.

However, in the substrate processing apparatus 1 of embodiments, when various processing gases are supplied from the side direction of the multiple wafers W placed on the boat 16 accommodated in the internal tube 11 so as to form a film, the film thickness on each of the wafers W placed on the upper portion of the boat may be thicker in an outer peripheral portion than in a central portion. Therefore, in the embodiments, when supplying various processing gases, the dilution gas ejector 100 supplies the dilution gas from the side direction of the multiple wafers W placed on the upper portion of the boat 16 along surfaces of the multiple wafers W. As a result, the various processing gases are diluted with the dilution gas in the outer peripheral portion of each wafer W, and concentration of a processing gas in the outer peripheral portion of each wafer W is lowered. Therefore, it is possible to prevent the film thickness in the outer peripheral portion of each wafer W from becoming thicker than the film thickness in the central portion. As a result, it is possible to improve the in-plane uniformity of the thickness of a film formed on each wafer W.

With the substrate processing apparatus 1 of the embodiments, since the dilution gas ejector 100 including the multiple ejection portions 132a to 132b is provided, even when the dilution gas is ejected from multiple locations of the side direction of the wafers W, the number of dilution gas nozzles 32 may be one. Therefore, it is possible to reduce the number of the dilution gas nozzles 32 to 1/4 compared with the case where the dilution gas ejector 100 is not provided.

[Substrate Processing Method]

The substrate processing method of an embodiment will be described by using as an example, a method of forming a silicon nitride film on a wafer W through a chemical vapor deposition (CVD) method using the substrate processing apparatus 1 described above.

First, the controller 90 controls the lift mechanism 25 to load the boat 16 holding multiple wafers W into the processing container 10, and the lower end opening of the processing container 10 is hermetically sealed by the lid 21.

Subsequently, the controller 90 executes a process of ejecting a hexachlorodisilane (HCD) gas into the processing container 10 from at least one of the processing gas nozzles 31a to 31g, and ejecting an ammonia gas into the processing container 10 from at least one of the other processing gas nozzles. The HCD gas and ammonia gas are examples of processing gases. In addition, the controller 90 executes a process of distributing a dilution gas introduced into the dilution gas ejector 100 via the dilution gas nozzle 32 in the dilution gas ejector 100 and ejecting the dilution gas from the outer peripheral portion in the upper portion of the processing container 10. A nitrogen gas is an example of the dilution gas. In this way, a silicon nitride film is formed on the wafers W by ejecting the HCD gas and the ammonia gas from the processing gas nozzles 31a to 31g while ejecting nitrogen gas from the dilution gas ejector 100.

Subsequently, the controller 90 stops the ejection of HCD gas, ammonia gas, and nitrogen gas, and controls the lift mechanism 25 to unload the boat 16 from the inside of the processing container 10.

As described above, according to the substrate processing method of the embodiments, a silicon nitride film is formed on wafers W by ejecting the HCD gas and the ammonia gas from the processing gas nozzles 31a to 31g while ejecting the nitrogen gas from the dilution gas ejector 100. As a result, various processing gases are diluted with the dilution gas at the outer peripheral portion of each wafer W, and concentration of the processing gas at the outer peripheral portion of each wafer W is lowered. Therefore, it is possible to prevent the film thickness in the outer peripheral portion of each wafer W from becoming thicker than the film thickness in the central portion. As a result, it is possible to improve the in-plane uniformity of the thickness of a film formed on each wafer W.

Further, a period for ejecting the dilution gas from the dilution gas ejector 100 may be, for example, the entire period during which the HCD gas and the ammonia gas is ejected, or part of the period during which the HCD gas and the ammonia gas are ejected.

EXAMPLE

In an example, numerical analysis was performed on a film thickness when a silicon nitride film was formed by ejecting a hexachlorodisilane (HCD) gas and an ammonia gas from the processing gas nozzles while ejecting a nitrogen gas from the dilution gas ejector 100 of the substrate processing apparatus 1 according to embodiments. The nitrogen gas is an example of a dilution gas, and the HCD gas and the ammonia gas are examples of processing gases. In the numerical analysis, general-purpose fluid analysis software (Fluent) manufactured by Ansys Corp. was used.

Figure 18:
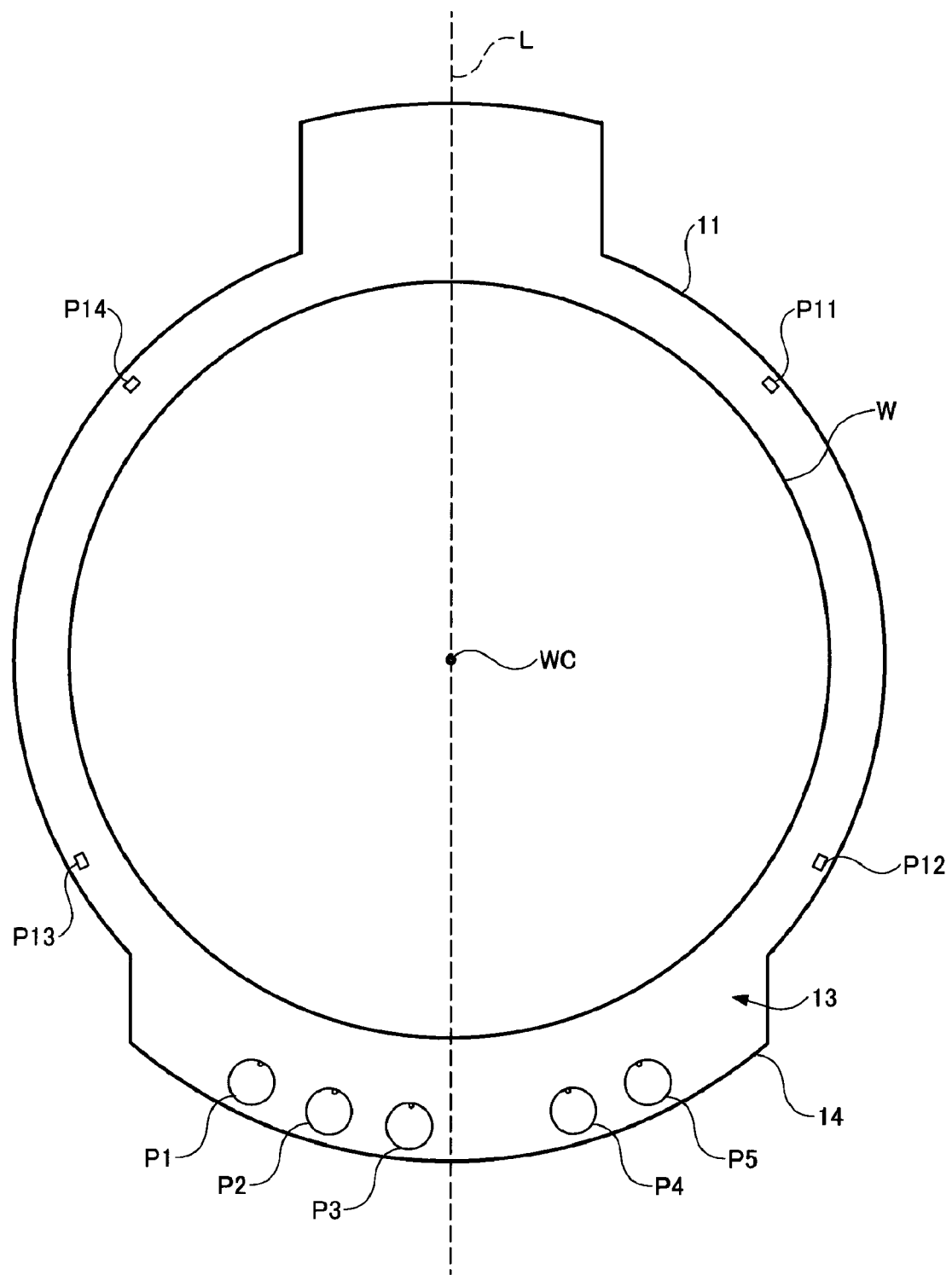
FIG. 18 is a diagram for describing an analysis model.

FIG. 18 is a diagram for describing an analysis model. As illustrated in FIG. 18, as an example, an analysis model in which the gas nozzles P1 to P5 and the gas ejection portions P11 to P14 are arranged in the internal tube 11 was prepared.

The gas nozzles P1 to P5 are arranged at intervals in the accommodation portion 13 inside the inner wall of the internal tube 11 so as to form a line along a circumferential direction, and are set to eject gas toward a center of a wafer W.

The gas ejection portions P11 and P14 are arranged on the outer peripheral portion of the inner tube 11 on a side opposite to a side at which the accommodation portion 13 is formed, and are set to eject gas toward the center of the wafer W. In addition, the gas ejection portion P11 and the gas ejection portion P14 are arranged at positions symmetrical with respect to a line L in a radial direction connecting a center of the accommodation portion 13 in the circumferential direction and the center WC of the wafer W.

The gas ejection portions P12 and P13 are arranged on the outer peripheral portion of the internal tube 11 on the side where the accommodation portion 13 is formed, and are set to eject a gas toward the center of the wafer W. Further, the gas ejector P12 and the gas ejector P13 are arranged at positions symmetrical with respect to the radial direction line L.

In Example 1, while ejecting the nitrogen gas from each of the four gas ejection portions P11 to P14, thickness of a silicon nitride film formed by ejecting the nitrogen gas from the gas nozzle P1, the HCD gas/nitrogen gas from the gas nozzle P2, and the ammonia gas from the gas nozzle P3 was calculated. The flow rate of the nitrogen gas ejected from each of the gas ejection portions P11 to P14 was set to 50 sccm. In addition, the flow rate of the nitrogen gas ejected from the gas nozzle P1 was set to 500 sccm, the flow rate of the HCD gas/nitrogen gas ejected from the gas nozzle P2 was set to 300 sccm/5000 sccm, and the flow rate of the ammonia gas ejected from the gas nozzle P3 was set to 2500 sccm.

In Example 2, while ejecting nitrogen gas from each of the two gas ejection portions P12 and P13, a thickness of a silicon nitride film formed by ejecting the nitrogen gas from the nozzle gas P1, the HCD gas/nitrogen gas from the gas nozzle P2, and the ammonia gas from the gas nozzle P3 was calculated. The flow rates of the gases ejected from the gas ejection portions P12 and P13 and the gas nozzles P1 to P3 were set to be the same as those in Example 1.

In Comparative Example 1, without ejecting the nitrogen gas from each of the four gas ejection portions P11 to P14, a thickness of a silicon nitride film formed by ejecting the nitrogen gas from the gas nozzle P1, the HCD gas/nitrogen gas from the gas nozzle P2, and ammonia gas from the gas nozzle P3 was calculated. In addition, the flow rates of the gases ejected from the gas nozzles P1 to P3 were set to be the same as those in Example 1.

Further, based on the film thicknesses of the silicon nitride films calculated in Example 1, Example 2, and Comparative Example 1, a film formation rate and uniformity of the film thickness in a plane of each wafer W were calculated.

Figure 19:
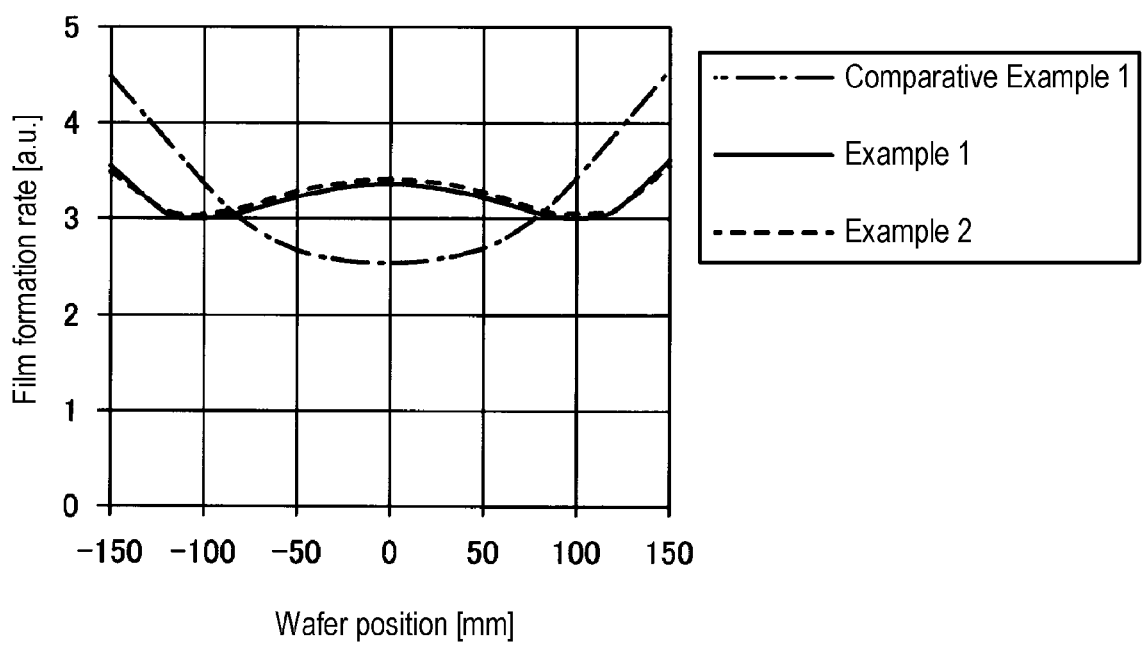
FIG. 19 is a diagram showing results of numerical analysis of film forming rates in a plane of a wafer.

FIG. 19 is a diagram showing results of numerical analysis of film formation rates in a plane of each wafer W. In FIG. 19, a horizontal axis represents a wafer position [mm], and a vertical axis represents a film formation rate [a.u.]. Regarding the wafer position, the center of each wafer W was set to 0 mm, and the outer circumference of each wafer W was set to ±150 mm. In FIG. 19, a solid line, a broken line, and a one-dot chain line indicate results of numerical analysis of the film formation rates in Example 1, Example 2, and Comparative Example 1, respectively.

As shown in FIG. 19, in Comparative Example 1 (see the one-dot chain line), it can be seen that film thickness in an outer peripheral portion of a wafer W is larger than the film thickness in a central portion. In contrast, in each of Example 1 (see the solid line) and Example 2 (see the broken line), it can be seen that film thickness in outer peripheral portions of wafers W are smaller than that of Comparative Example 1 (see the one-dot chain line), and differences in film thickness between outer peripheral portions and central portions are smaller.

Figure 20:
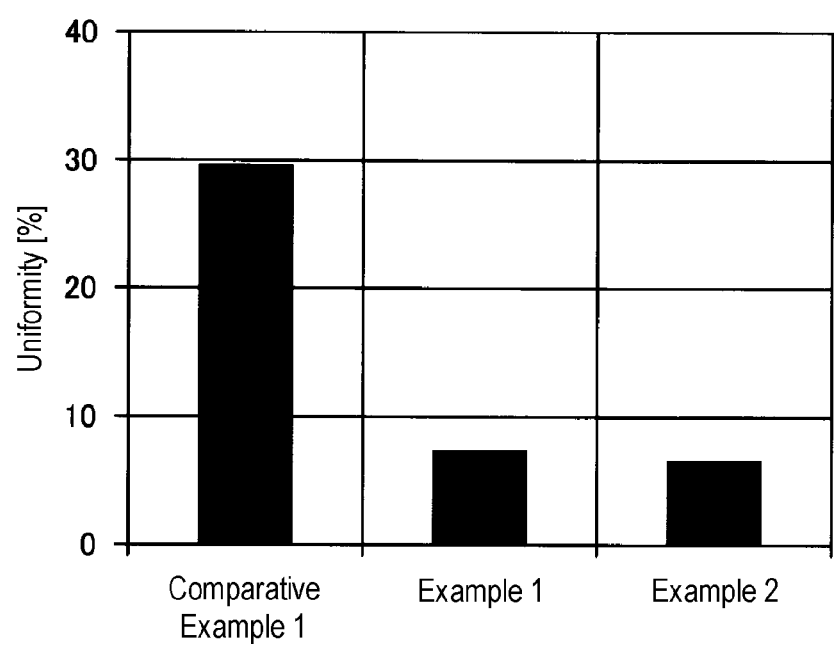
FIG. 20 is a diagram showing results of numerical analysis of uniformity in film thickness in a plane of a wafer.

FIG. 20 is a diagram showing results of numerical analysis of uniformity in the film thickness in a plane of each wafer W. In FIG. 20, the numerical analysis results of the uniformity [%] in Comparative Example 1, Example 1, and Example 2 are shown in order from the left side. A value [%] obtained by dividing a difference between a maximum value and a minimum value in the graph of FIG. 19 by an average value was defined as the uniformity [%].

As shown in FIG. 20, it can be seen that the uniformity is about 30% in Comparative Example 1, while the uniformity is 10% or less in Examples 1 and 2.

From the above results, it can be said that in Examples 1 and 2, the in-plane uniformity of the film thickness can be improved when compared to Comparative Example 1. That is, when the processing gases (the HCD gas and the ammonia gas) are being supplied, by supplying a dilution gas along the surfaces of multiple wafers W from a side of the wafers W, it is possible to improve the in-plane uniformity of thickness of a film (silicon nitride film) formed on each wafer.

In the embodiments described above, the dilution gas nozzle 32 is an example of a gas nozzle, and the dilution gas ejector 100 is an example of a gas ejector.

It should be understood that the embodiments disclosed herein are illustrative and are not limiting in all aspects. The above-described embodiments may be omitted, replaced, or modified in various forms without departing from the scope and spirit of the appended claims.

In the embodiments described above, the case where the processing gas nozzle and the dilution gas nozzle are straight pipes has been described as an example, but the present disclosure is not limited thereto. For example, each of the processing gas nozzle and the dilution gas nozzle may be an L-shaped pipe that is bent in an L shape at a lower portion and penetrates a side wall of an external tube.

In the embodiments described above, the dilution gas ejector 100 configured to distribute and eject the dilution gas has been described as being provided in the processing container 10 as an example, but the present disclosure is not limited thereto. For example, instead of the dilution gas ejector 100, a processing gas ejector configured to distribute and eject a processing gas may be provided in the processing container 10. Further, in addition to the dilution gas ejector 100, a processing gas ejector may be provided.

In the embodiments described above, the substrate processing apparatus 1 has been described to be provided with seven processing gas nozzles 31a to 31g and one dilution gas nozzle 32 as an example, but the present disclosure is not limited thereto. For example, the number of processing gas nozzles may be one, two to six, or eight or more, and the number of dilution gas nozzles may be two or more. When the number of dilution gas nozzles is two or more, a fitting portion and a horizontal portion included in an inlet may be provided according to the number of dilution gas nozzles.

In the embodiments described above, a dilution gas has been described as being ejected from the dilution gas ejector 100 so as to dilute a film forming gas when a film is formed on a wafer W using the film forming gas as an example, but the present disclosure is not limited thereto. For example, when a film is etched using an etching gas, the dilution gas may be ejected from the dilution gas ejector 100 so as to dilute the etching gas.

According to the present disclosure, it is possible to improve the in-plane uniformity of processing.

While certain embodiments have been described, these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A substrate processing apparatus comprising:
a processing container having a substantially cylindrical shape;
a gas nozzle extending in a vertical direction along an inside of an inner wall of the processing container and forming a gas flow path therein; and
a gas ejector provided on the processing container and communicating with the gas flow path, the gas ejector being configured to distribute a gas introduced from the gas nozzle and to eject the gas from an outer peripheral portion of the processing container,
wherein the gas ejector includes:
an inlet forming an inflow path communicating with the gas flow path;
an outlet forming multiple outflow paths configured to eject the gas into the processing container; and
a distribution portion forming a distribution path which enables the inflow path to communicate with the multiple outflow paths, and
wherein the outlet includes:
a horizontal portion including one end connected to the distribution portion and another end extending to the outer peripheral portion of the processing container along a radial direction of the processing container; and
an ejection portion extending downward from the other end of the horizontal portion and having a gas hole formed therein.

2. The substrate processing apparatus of claim 1, wherein the inlet includes:
a fitting portion into which an upper portion of the gas nozzle is inserted; and
another horizontal portion having one end connected to the fitting portion and another end connected to the distribution portion.

3. The substrate processing apparatus of claim 2, wherein the ejection portion extends to a portion of a height area which includes an upper portion of the processing container.

4. The substrate processing apparatus of claim 3, wherein the gas ejector is provided on the processing container and includes a disk-shaped lid, and
the inlet, the outlet, and the distribution portion are provided at the lid.

5. The substrate processing apparatus of claim 4, wherein the distribution portion is disposed at a center of the lid.

6. The substrate processing apparatus of claim 5, wherein the lid is provided with a position regulator configured to regulate a position of the lid with respect to the processing container.

7. The substrate processing apparatus of claim 6, wherein the position regulator extends downward from a bottom surface of the lid and extends in an arc shape along a circumferential direction of the lid.

8. The substrate processing apparatus of claim 7, further comprising:
a processing gas nozzle extending in the vertical direction along the inside of the inner wall of the processing container and configured to eject a processing gas into the processing container,
wherein the gas ejected from the gas ejector is a dilution gas that dilutes the processing gas.

9. The substrate processing apparatus of claim 4, wherein the lid is provided with a position regulator configured to regulate a position of the lid with respect to the processing container.

10. The substrate processing apparatus of claim 1, wherein the gas ejector is provided on the processing container and includes a disk-shaped lid, and
the inlet, the outlet, and the distribution portion are provided at the lid.

11. The substrate processing apparatus of claim 1, wherein the distribution portion has a donut shape.

12. The substrate processing apparatus of claim 1, further comprising:
a processing gas nozzle extending in the vertical direction along the inside of the inner wall of the processing container and configured to eject a processing gas into the processing container,
wherein the gas ejected from the gas ejector is a dilution gas that dilutes the processing gas.

* * * * *